United States Patent [19]
Seevinck

[11] Patent Number: 6,060,870
[45] Date of Patent: May 9, 2000

[54] VOLTAGE-TO-CURRENT CONVERTER WITH ERROR CORRECTION

[75] Inventor: Evert Seevinck, Eersel, Netherlands

[73] Assignee: U.S. Philips Corporation, New York, N.Y.

[21] Appl. No.: 09/038,567

[22] Filed: Mar. 11, 1998

[30] Foreign Application Priority Data

Mar. 13, 1997 [EP] European Pat. Off. .............. 97200754

[51] Int. Cl.[7] ............................... G06F 1/40; G06F 3/20; H02M 7/00
[52] U.S. Cl. ............................ 323/273; 323/316; 363/73
[58] Field of Search .................................. 323/273, 315, 323/316, 312; 363/73; 327/562

[56] References Cited

U.S. PATENT DOCUMENTS

| | | | |
|---|---|---|---|
| 4,682,098 | 7/1987 | Seevinck et al. | 323/315 |
| 5,043,652 | 8/1991 | Rybicki et al. | 323/316 |
| 5,493,205 | 2/1996 | Gorecki | 323/315 |
| 5,497,074 | 3/1996 | Boezen | 323/316 |
| 5,510,738 | 4/1996 | Gorecki et al. | 327/103 |
| 5,574,678 | 11/1996 | Gorecki | 708/801 |
| 5,617,064 | 4/1997 | Gorecki | 333/213 |
| 5,619,122 | 4/1997 | Kearney et al. | 323/312 |
| 5,666,087 | 9/1997 | Gorecki | 330/260 |

FOREIGN PATENT DOCUMENTS 0620513 10/1994 European Pat. Off. .

Primary Examiner—Edward H. Tso
Assistant Examiner—Rajnikant B. Patel
Attorney, Agent, or Firm—Steven R. Biren

[57] ABSTRACT

A voltage-current converter includes a signal voltage source (2), a series resistor (4) and an electronic circuit with a first transconductance amplifier (12) and a second transconductance amplifier (22). The corresponding inputs (16, 20; 24, 26) of the transconductance amplifiers (12, 22) are connected to receive a voltage difference ($V_A$) between a node (18) and a reference terminal (8). The output (14) of the first transconductance amplifier (12) is connected to an input terminal (6) to which the series resistor (4) is connected as well. The output (25) of the second transconductance amplifier (22) is connected to an output terminal (10). Due to feedback around the first transconductance amplifier (12) an input current ($i_1$) can flow into the input terminal (6). The input current ($i_1$) is amplified or copied by the second transconductance amplifier (22) and is available at an output terminal (10). The input current ($i_1$) is not only dependent on the series resistor (4), but also on the voltage difference ($V_A$) between the node (18) and the reference terminal (8). The distortion caused by the voltage difference is cancelled by measuring (28) this voltage difference and adding (30) this voltage difference to the input voltage signal ($V_S$) in the proper sense.

7 Claims, 4 Drawing Sheets

VOLTAGE-TO-CURRENT CONVERTER WITH ERROR CORRECTION

BACKGROUND OF THE INVENTION

The invention relates to an electronic circuit comprising:

an input terminal and a reference terminal for receiving an input current flowing through the input terminal and the reference terminal;

an output terminal for generating an output current flowing through the output terminal and the reference terminal;

a first transconductance amplifier having an output coupled to the input terminal and having inputs connected to receive a voltage difference between a first node and the reference node;

a second transconductance amplifier having an output coupled to the output terminal and having inputs connected to receive said voltage difference between the first node and the reference node; and means for coupling the input terminal to the first node.

Well-known methods of voltage-current conversion have the disadvantage of signal distortion due to circuit non-linearity, particularly at high frequencies. FIG. 1 shows a known general technique. An input voltage $V_S$ from source 2 is connected, via a series resistor 4, to an input terminal 6 and a reference terminal 8 of an electronic circuit which provides an output current $i_2$ at an output terminal 10 in response to an input current $i_1$ which flows into the input terminal 6. The electronic circuit comprises a first transconductance amplifier 12 with an output 14 coupled to the input terminal 6, an inverting input 16 coupled to a first node 18 and a non-inverting input 20 coupled to the reference terminal 8 which serves as signal ground. A short-circuit between the input terminal 6 and the first node 18 provides a zero signal difference between the input terminal 6 and the first node 18. The electronic circuit further comprises a second transconductance amplifier 22 with an output 25 coupled to the output terminal 10, an inverting input 24 coupled to the first node 18 and a non-inverting input 26 coupled to the reference terminal 8. The first and second transconductance amplifiers 12 and 22 have a transconductance $g_1$ and $g_2$, respectively. They can be very simple, e.g. single bipolar or MOS transistors, in which case the output, inverting input and non-inverting input of the transconductance amplifier corresponds to the collector, base and emitter, respectively, of a bipolar transistor or to the drain, gate and source, respectively, of a MOS transistor. Such a two transistor arrangement is known as a current mirror with a current gain $i_2/i_1=g_2/g_1$, which in combination with the series resistor 4 provides fast voltage-current converter useful up to high frequencies.

However, conversion errors occur. It follows from the circuit diagram that:

$$i_1 = \frac{V_S}{R_S + \frac{1}{g_1}} \quad i_2 = \frac{g_2}{g_1} i_1$$

$V_A$ is the signal voltage difference between the first node 18 and the reference terminal 8 and $R_S$ is the resistance of series resistor 4. In the expression for $i_1$, the transconductance $g_1$ is normally not well-defined, temperature dependent and nonlinear. Therefore the current $i_1$ will suffer from distortion. The ratio $g_2/g_1$ enables variable gain to be achieved and is generally well-defined and linear since the peculiarities of transconductance $g_1$ are compensated by those of transconductance $g_2$. It follows that also the output current $i_2$ will suffer from distortion.

SUMMARY OF THE INVENTION

It is an object of the invention to provide an electronic circuit arrangement with less distortion. To this end the electronic circuit as specified in the opening paragraph is characterized in that the means for coupling comprises:

means for measuring the voltage difference between the first node and the reference terminal; and means for inserting said voltage difference between the input terminal and the first node.

The invention is based on the recognition that the source of distortion is the signal voltage $V_A$ at the first node 18. This error signal is measured and added to the input voltage signal $V_S$ by inserting the measured error voltage between the input terminal 6 and the first node 18. This is shown in FIG. 2. Now the current $i_1$ is given by:

$$i_1 = \frac{V_S - V_A + V_A}{R_S} = \frac{V_S}{R_S}$$

When compared to the above expression it can be seen that the distortion-inducing term has disappeared and the voltage-current conversion is perfect.

The technique outlined above may be implemented through the use of two additional transconductance amplifiers, preferably with mutually equal transconductances. To this end in an embodiment of the electronic circuit the means for measuring comprises a third transconductance amplifier having an output coupled to the first node and having inputs connected to receive said voltage difference between the first node and the reference node; and the means for inserting comprises a fourth transconductance amplifier having an output coupled to the first node and having inputs connected to receive a voltage difference between the input terminal and the first node.

The signals at the inputs of the third transconductance amplifier and the fourth transconductance amplifier are reversed copies of each other since the output currents of both transconductance amplifiers are equal but opposite in direction. So, the error signal at the first node appears in opposite direction between the input terminal and the first node, thereby counter-acting the effect of the error signal.

Advantageous embodiments are defined in the dependent claims which specify transistor implementations of the first to fourth transconductance amplifiers. The transistors may be bipolar transistors or unipolar (MOS) transistors.

BRIEF DESCRIPTION OF THE DRAWING

These and other aspects of the invention will be described in more detail, by way of example, with reference to the accompanying drawings, in which.

In the Figures corresponding elements have the same reference signs.

DESCRIPTION OF THE PREFERRED EMBODIMENTS

Although the embodiments to be described and shown in the accompanying Figures are illustrated with bipolar transistors, the embodiments can also be implemented with unipolar or MOS transistors. For bipolar transistors the control electrode, first main electrode and second main electrode correspond to the base, emitter and collector, respectively. For MOS transistors the control electrode, first main electrode and second main electrode correspond with the gate, source, and drain, respectively.

Figure 1:
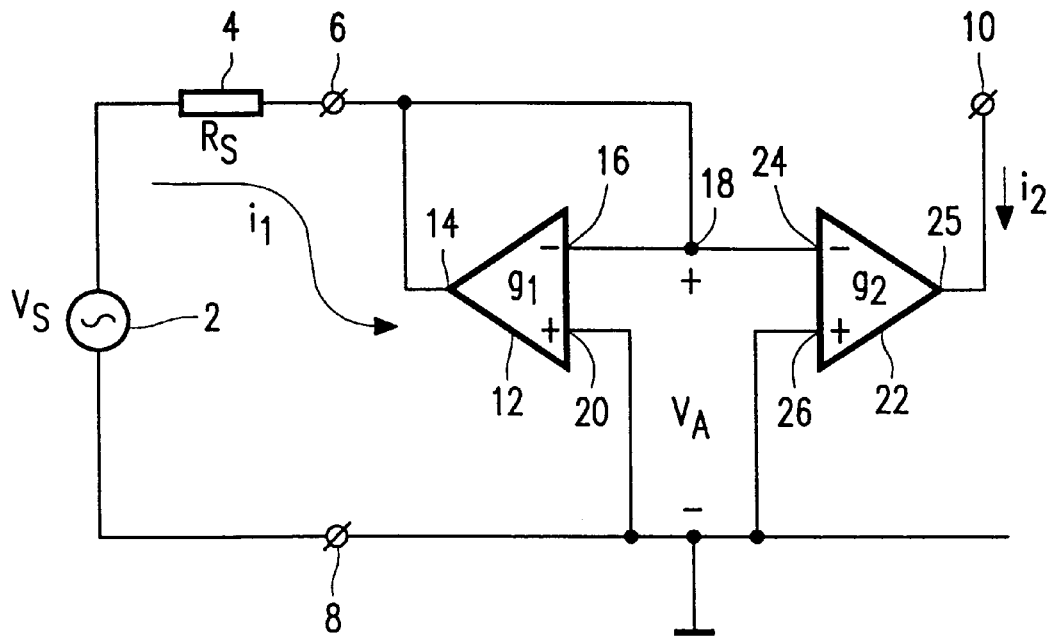
FIG. 1 shows a circuit diagram of a conventional voltage-current converter.

FIG. 1 shows a known general technique for converting an input voltage $V_S$ into an output current $i_2$. The input voltage $V_S$ from a source 2 is connected, via a series resistor 4, to an input terminal 6 and a reference terminal 8 of an electronic circuit which provides an output current $i_2$ at an output terminal 10 in response to an input current $i_1$ which flows into the input terminal 6. The electronic circuit comprises a first transconductance amplifier 12 with an output 14 coupled to the input terminal 6, an inverting input 16 coupled to a first node 18 and a non-inverting input 20 coupled to the reference terminal 8 which serves as signal ground. A short-circuit between the input terminal 6 and the first node 18 provides a zero signal difference between the input terminal 6 and the first node 18. The electronic circuit further comprises a second transconductance amplifier 22 with an output 25 coupled to the output terminal 10, an inverting input 24 coupled to the first node 18 and a non-inverting input 26 coupled to the reference terminal 8. The first and second transconductance amplifiers 12 and 22 have a transconductance $g_1$ and $g_2$, respectively. They can be very simple, e.g. single bipolar or MOS transistors, in which case the output, inverting input and non-inverting input of the transconductance amplifier corresponds to the collector, base and emitter, respectively, of a bipolar transistor or to the drain, gate and source, respectively, of a MOS transistor. Such a two transistor arrangement is known as a current mirror with a current gain $i_2/i_1=g_2/g_1$, which in combination with the series resistor 4 provides fast voltage-current converter useful up to high frequencies.

It follows from the circuit diagram that:

$$i_1 = \frac{V_S - V_A}{R_S} \tag{1a}$$

$$V_A = \frac{i_1}{g_1} \tag{1b}$$

$$i_1 = \frac{V_S}{R_S + \frac{1}{g_1}} \tag{1c}$$

$$i_2 = \frac{g_2}{g_1} i_1 \tag{1d}$$

$V_A$ is the signal voltage difference between the first node 18 and the reference terminal 8 and $R_S$ is the resistance of series resistor 4. In expression 1c for $i_1$, the transconductance $g_1$ is normally not well-defined, temperature dependent and non-linear. Therefore the current $i_1$ will suffer from distortion. The ratio $g_2/g_1$ enables variable gain to be achieved and is generally well-defined and linear since the peculiarities of transconductance $g_1$ are compensated by those of transconductance $g_2$. It follows that also the output current $i_2$ will suffer from distortion.

Figure 2:
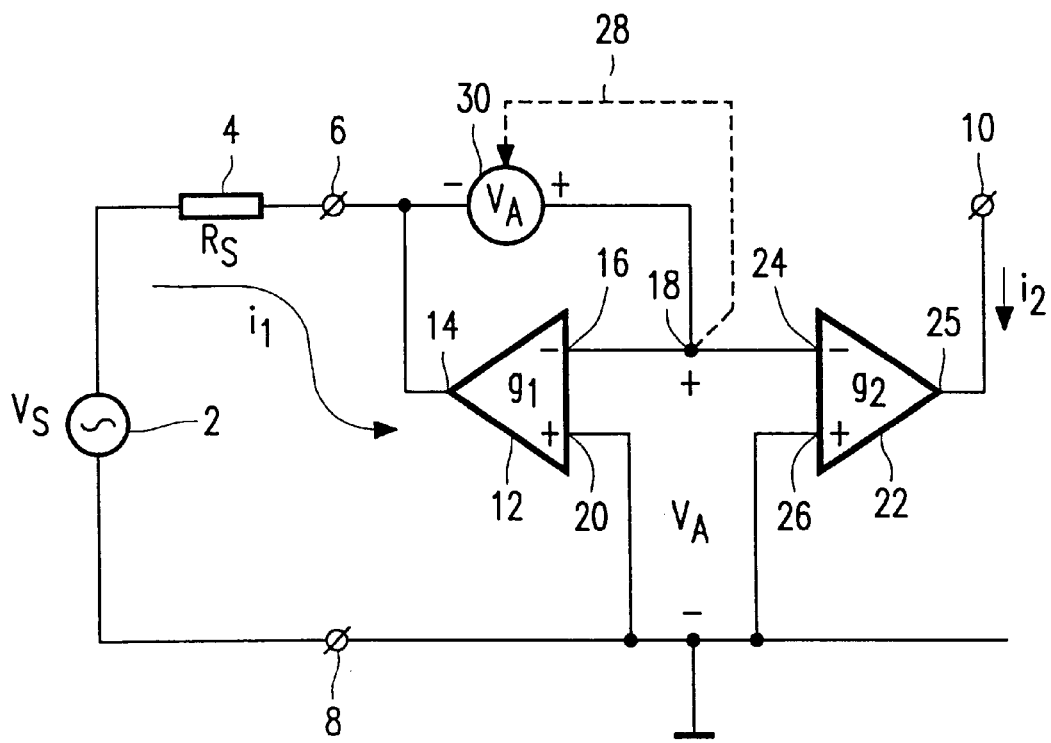
FIG. 2 shows a circuit diagram of a voltage-current converter according to the invention.

FIG. 2 shows a circuit diagram of a voltage-current converter according to the invention. The technique employed is based on the recognition that the source of distortion is the signal voltage $V_A$ at the first node 18. This error signal $V_A$ is measured, symbolically depicted with sensing or measuring means 28, and added to the input voltage signal $V_S$ by inserting the measured error voltage between the input terminal 6 and the first node 18, symbolically depicted with voltage source 30. In this configuration the current $i_1$ is given by:

$$i_1 = \frac{V_S - V_A + V_A}{R_S} = \frac{V_S}{R_S} \tag{2}$$

When compared to expression 1c it can be seen that the distortion-inducing term $V_A$ has disappeared and the voltage-current conversion $i_2/V_S$ is perfect.

Figure 3:
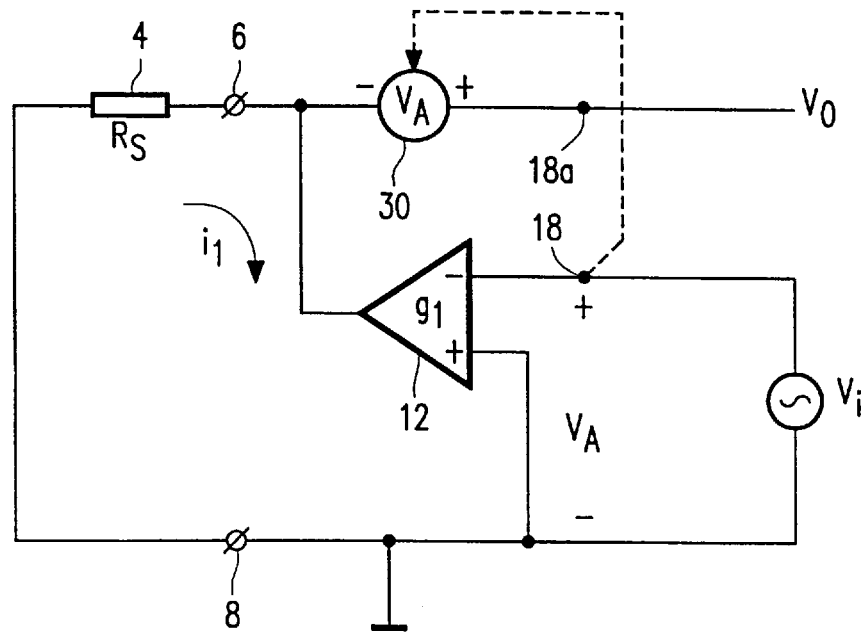
FIG. 3 shows a circuit for elucidating the operation of the voltage-current converter according to the invention.

The compensation technique involves positive feedback combined with the negative feedback already present around transconductance amplifier 12. The stability is considered in connection with the circuit diagram of FIG. 3 in which the loop around transconductance amplifier 12 is opened at the nodes 18 and 18a. A signal $V_i$ is applied to node 18 and the resulting signal at node 18a is $V_o$. The open-loop gain, i.e. $V_o/V_i$ the follows from the following equations:

$$V_o = V_A - i_1 R_S \tag{3a}$$

$$i_1 = g_1 V_i \tag{3b}$$

$$V_A = V_i \tag{3c}$$

$$V_o = V_i - g_1 R_S V_i = (1 - g_1 R_S) V_i \tag{3d}$$

$$\frac{V_o}{V_i} = 1 - g_1 R_S \tag{3e}$$

For closed-loop stability the open-loop gain should be <1. From equation 3e it follows that:

$$g_1 R_S > 0 \tag{3f}$$

This condition is always fulfilled since both $g_1$ and $R_S$ are positive.

Figure 4:
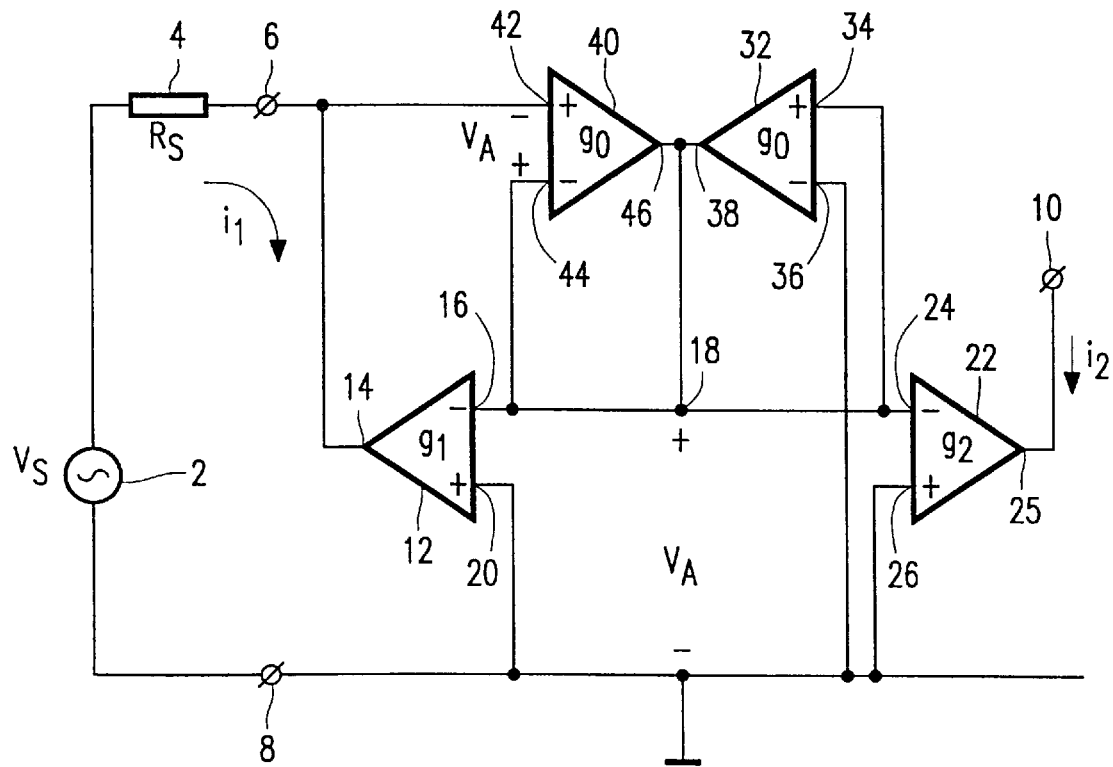
FIG. 4 shows a circuit diagram of an embodiment of an voltage-current converter according to the invention.

FIG. 4 shows an implementation of the error correction technique through the use of two additional transconductance amplifiers. The error voltage $V_A$ is measured by a third transconductance amplifier 32, which has a non-inverting input 34 connected to the node 18, an inverting input 36 connected to the reference terminal 8 and an output 38 connected to the node 18. An opposite error voltage $V_A$ is inserted between the input terminal 6 and the node 18 by a fourth transconductance amplifier 40, which has a non-inverting input 42 connected to the input terminal 6, and an inverting input 44 and an output 45 connected to the node 18. The output current from the output 38 of transconductance amplifier 32 flows into the output 46 of transconductance amplifier 40 and causes at the inputs 42 and 44 of transconductance amplifier 40 a voltage with an amplitude equal to the amplitude of the error voltage $V_A$, but with opposite sign.

All four transconductance amplifiers 12, 22, 32 and 40 can be very simple. The third transconductance amplifier 32 and the fourth transconductance amplifier 40 preferably have substantially equal transconductances $g_0$ in order to achieve the best error correction performance. The transconductances $g_1$ and $g_2$ of the other two transconductance amplifiers 12 and 22 can be unequal in order to obtain current gain. The overall transfer function of the voltage-current converter is given by:

$$i_2 = \left(\frac{g_2}{g_1}\right)\frac{V_S}{R_S} \quad (4)$$

This is an accurate, distortionless transfer with variable gain $g_2/g_1$, and valid up to high frequencies.

Figure 5:
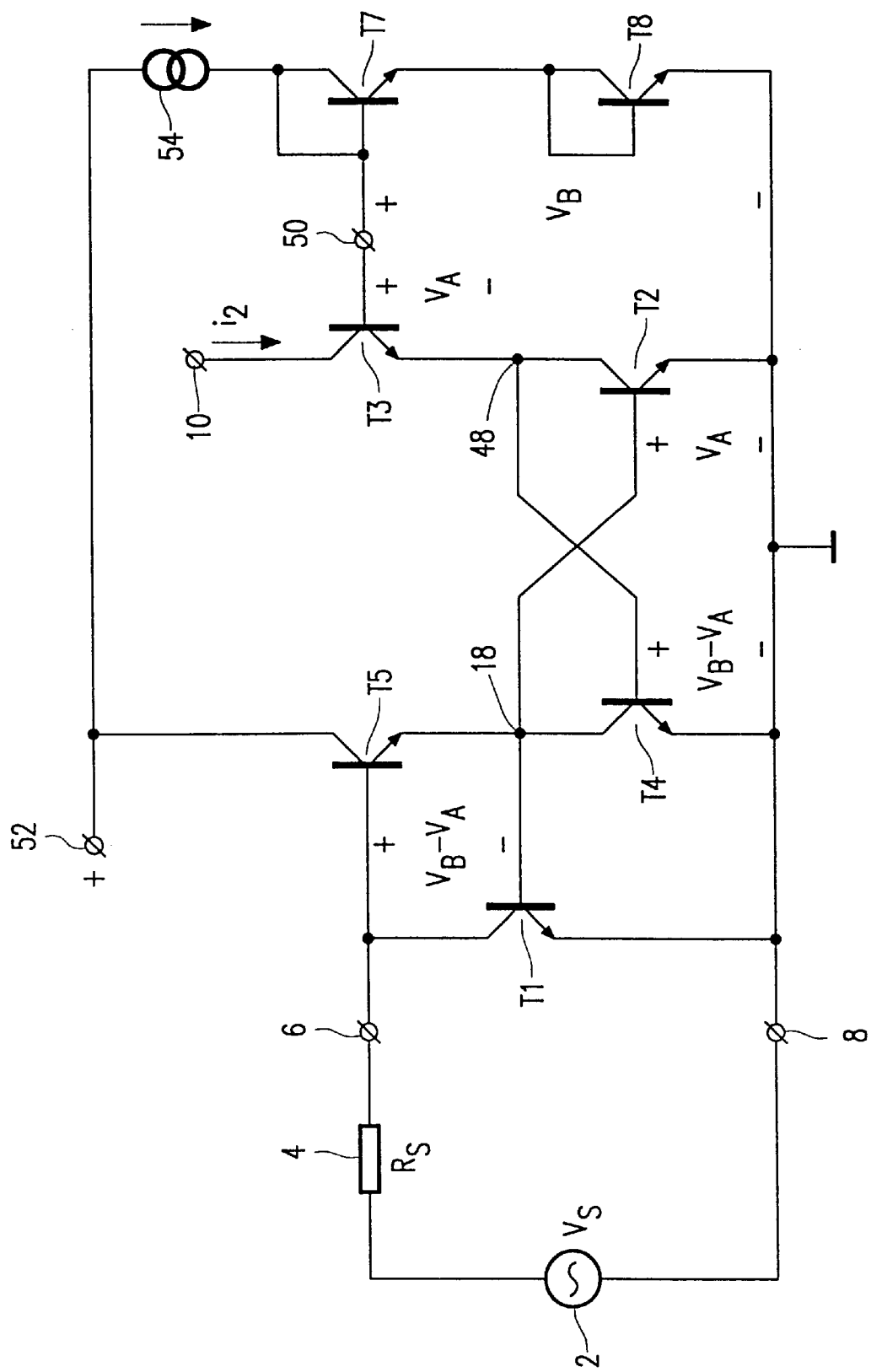
FIG. 5 shows a circuit diagram of an embodiment of an voltage-current converter according to the invention.

FIG. 5 shows a first transistor implementation of the four transconductance amplifier configuration of FIG. 4. The first transconductance amplifier 12 is implemented with transistor T1, which has its emitter, base and collector connected to the reference terminal 8, the first node 18 and the input terminal 6, respectively. The second transconductance amplifier 22 is implemented with transistor T2, which has its emitter, base and collector connected to the reference terminal 8, the first node 18 and a second node 48, respectively. Transistor T3 and transistor T4 form the third transconductance amplifier 32. The emitter, base and collector of transistor T3 are connected to the second node 48, a bias voltage terminal 50 and the output terminal 10, respectively. The collector of transistor T2, which corresponds to the output 25 of the second transconductance amplifier 22, is thus coupled to the output terminal 10 via the main current path of transistor T3. The emitter, base and collector of transistor T4 are connected to the reference terminal 8, the second node 48 and the first node 18, respectively. Transistor T5 is the fourth transconductance amplifier 40 and has its emitter, base and collector connected to the first node 18, the input terminal 6 and a supply voltage terminal 52. Coupling the emitter current of transistor T5 to the first node 18 has substantially the same effect as coupling the collector current to the first node 18, as would be expected from FIG. 4, because the emitter current and collector current if transistor T5 are nearly equal.

The bias voltage terminal 50 provides a bias voltage $V_B$ generated by means of two diode-connected transistors T7 and T8 series connected between the bias voltage terminal 50 and the reference terminal 8 and a bias current source 54 connected between the bias voltage terminal 50 and the supply voltage terminal 52. The base-emitter voltage of transistor T2 is equal to $V_A$. Since the current through transistor T2 flows through transistor T3, the base-emitter voltage of transistor T3 is also $V_A$. This implies that the voltage at the second node 48 and also the base-emitter voltage of transistor T4 is equal to $V_B-V_A$. The voltage $V_B-V_A$ in turn appears at the base-emitter junction of transistor T5 since the currents through transistors T4 and T5 are substantially equal. It appears that the voltage at the input terminal 6 is fixed at the bias voltage $V_B$ and no longer dependent on the error voltage $V_A$ at the first node 18.

Figure 6:
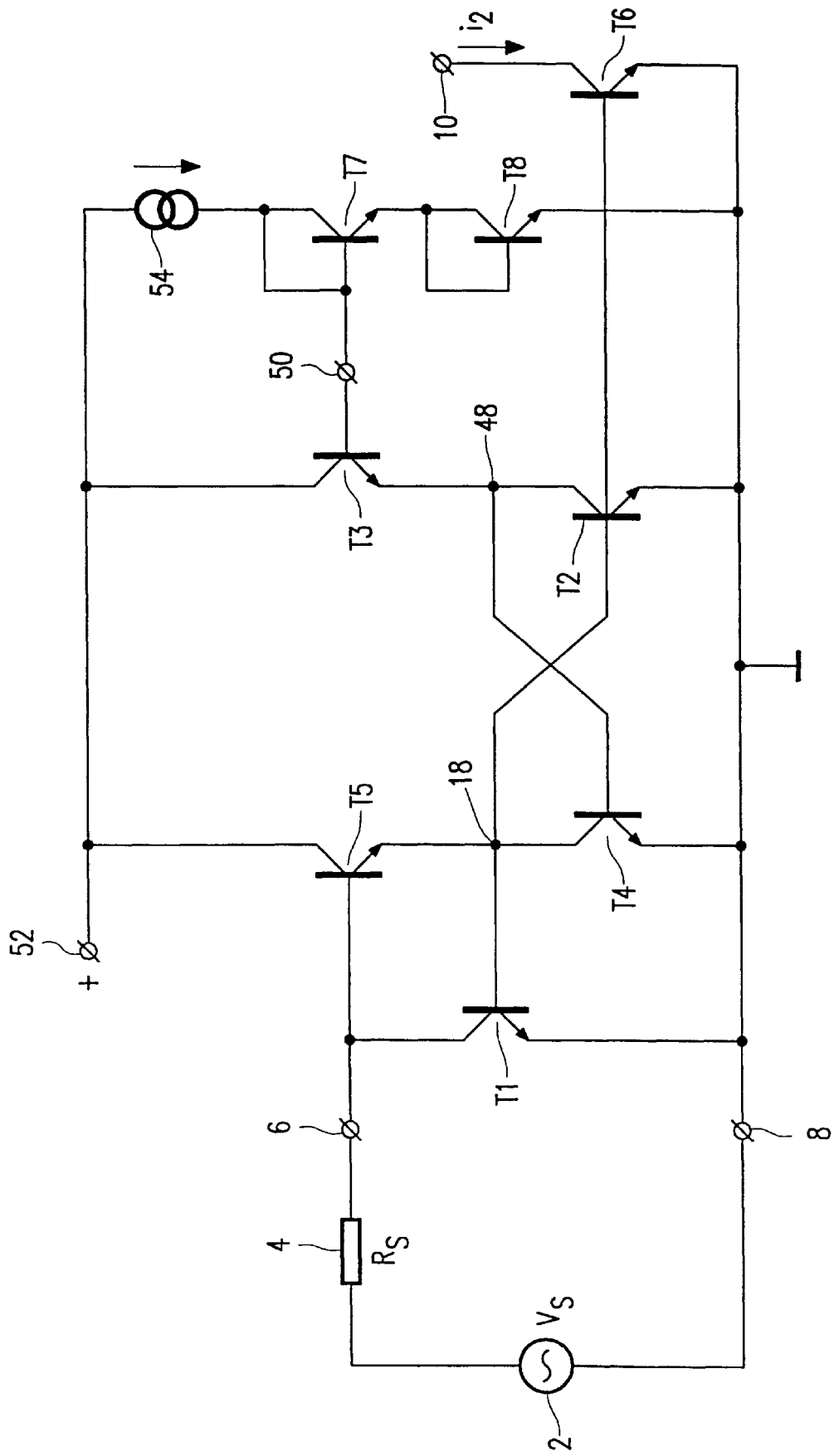
FIG. 6 shows a circuit diagram of an embodiment of an voltage-current converter according to the invention.

FIG. 6 shows a second transistor implementation which differs from the implementation shown in FIG. 5 in that the output current $i_2$ is not taken from the collector of transistor T3, but from the collector of a further transistor T6 which has its emitter, base and collector connected to the reference terminal 8, the first node 18 and the output terminal 10, respectively. The collector of transistor T3 is connected to the supply terminal 52. The current through transistor T2 is copied or multiplied in transistor T6. The additional transistor T6 makes this circuit suitable for use at high frequencies.

What is claimed is:

1. An electronic circuit comprising:
   an input terminal (6) and a reference terminal (8) for receiving an input current flowing through the input terminal (6) and the reference terminal (8);
   an output terminal (10) for generating an output current flowing through the output terminal (10) and the reference terminal (8);
   a first transconductance amplifier (12) having an output (14) coupled to the input terminal (6) and having inputs (16, 20) connected to receive a voltage difference between a first node (18) and the reference node (8);
   a second transconductance amplifier (22) having an output (25) coupled to the output terminal (10) and having inputs (24, 26) connected to receive said voltage difference between the first node (18) and the reference node (8); and
   means for coupling the input terminal (6) to the first node (18), characterized in that the means for coupling comprises:
   means (28) for measuring the voltage difference between the first node (18) and the reference terminal (8); and
   means (30) for inserting said voltage difference between the input terminal (6) and the first node (18).

2. An electronic circuit as claimed in claim 1, wherein the means (28) for measuring comprises a third transconductance amplifier (32) having an output (38) coupled to the first node (18) and having inputs (34, 36) connected to receive said voltage difference between the first node (18) and the reference node (8); and the means (30) for inserting comprises a fourth transconductance amplifier (40) having an output (46) coupled to the first node (18) and having inputs (42) connected to receive a voltage difference between the input terminal (6) and the first node (18).

3. An electronic circuit as claimed in claim 2, wherein:
   the first transconductance amplifier (12) comprises a first transistor (T1) having a first main electrode coupled to the reference terminal (8), a second main electrode coupled to the input terminal (6) and a control electrode coupled to the first node (18);
   the third transconductance amplifier (32) comprises a second transistor (T3) having a first main electrode coupled to a second node (48), a second main electrode coupled to the output terminal (10) and a control electrode coupled to a bias voltage terminal (50), and a third transistor (T4) having a first main electrode coupled to the reference terminal (8), a second main electrode coupled to the first node (18) and a control electrode coupled to the second node (48);
   the second transconductance amplifier (22) comprises a fourth transistor (T2) having a first main electrode coupled to the reference terminal (8), a second main electrode coupled to the second node (48) and a control electrode coupled to the first node (18); and
   the fourth transconductance amplifier (40) comprises a fifth transistor (T5) having a first main electrode coupled to the first node (18), a second main electrode coupled to a supply voltage terminal (52) and a control electrode coupled to the input terminal (6).

4. An electronic circuit as claimed in claim 2, wherein:
   the first transconductance amplifier (12) comprises a first transistor (T1) having a first main electrode coupled to the reference terminal (8), a second main electrode coupled to the input terminal (6) and a control electrode coupled to the first node (18);

the third transconductance amplifier (32) comprises a second transistor (T3) having a first main electrode coupled to a second node (48), a second main electrode coupled to a supply voltage terminal (52) and a control electrode coupled to a bias voltage terminal (50), a third transistor (T4) having a first main electrode coupled to the reference terminal (8), a second main electrode coupled to the first node (18) and a control electrode coupled to the second node (48); and a fourth transistor (T2) having a first main electrode coupled to the reference terminal (8), a second main electrode coupled to the second node (48) and a control electrode coupled to the first node (18);

the second transconductance amplifier (12) comprises a fifth transistor (T6) having a first main electrode coupled to the reference terminal (8), a second main electrode coupled to the output terminal (10) and a control electrode coupled to the first node (18); and the fourth transconductance amplifier (12) comprises a sixth transistor (T5) having a first main electrode coupled to the first node (18), a second main electrode coupled to a supply voltage terminal (52) and a control electrode coupled to the input terminal (6).

5. An electronic circuit as claimed in claim 3, further comprising a chain of two diode-connected transistors (T7, T8) series-connected between the bias voltage terminal (50) and the reference terminal (8) and a bias current source (54) coupled to the chain for providing a bias current through the chain.

6. An electronic circuit as claimed in claim 1, further comprising a resistor (4) for coupling the input terminal (6) to a signal voltage source (2).

7. An electronic circuit as claimed in claim 4, further comprising a chain of two diode-connected transistors (T7, T8) series-connected between the bias voltage terminal (50) and the reference terminal (8) and a bias current source (54) coupled to the chain for providing a bias current through the chain.

* * * * *